(12) United States Patent
Jiang et al.

(10) Patent No.: US 9,397,223 B2
(45) Date of Patent: Jul. 19, 2016

(54) OXIDE THIN FILM TRANSISTOR WITH A METAL OXIDE ETCH BARRIER LAYER, METHOD OF MANUFACTURING THE SAME AND DISPLAY DEVICE

(71) Applicant: BOE TECHNOLOGY GROUP CO., LTD., Beijing (CN)

(72) Inventors: Chunsheng Jiang, Beijing (CN); Jingfei Fang, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 76 days.

(21) Appl. No.: 14/347,124

(22) PCT Filed: Dec. 13, 2013

(86) PCT No.: PCT/CN2013/089430
§ 371 (c)(1),
(2) Date: Mar. 25, 2014

(87) PCT Pub. No.: WO2014/173146
PCT Pub. Date: Oct. 30, 2014

(65) Prior Publication Data
US 2015/0171219 A1 Jun. 18, 2015

(30) Foreign Application Priority Data

Apr. 27, 2013 (CN) .......................... 2013 1 0153184

(51) Int. Cl.
*H01L 29/786* (2006.01)
*H01L 29/66* (2006.01)
(Continued)

(52) U.S. Cl.
CPC ...... *H01L 29/7869* (2013.01); *H01L 21/02178* (2013.01); *H01L 21/02244* (2013.01); *H01L 21/02565* (2013.01); *H01L 27/1225* (2013.01); *H01L 29/66969* (2013.01)

(58) Field of Classification Search
CPC ..................... H01L 29/7869; H01L 21/02178; H01L 21/02244; H01L 21/02565; H01L 27/1225; H01L 29/66969
See application file for complete search history.

(56) References Cited

U.S. PATENT DOCUMENTS

2011/0175087 A1* 7/2011 Yamazaki ........... H01L 21/8221
257/57
2011/0272691 A1* 11/2011 Kuegler ................ C07C 249/08
257/43

(Continued)

FOREIGN PATENT DOCUMENTS

| CN | 102646699 A | 8/2012 |
| CN | 102651322 A | 8/2012 |

(Continued)

OTHER PUBLICATIONS

Chinese Office Action of Chinese Application No. 201310153184.0, mailed Apr. 3, 2015 with English translation.

(Continued)

*Primary Examiner* — Peter Bradford
(74) *Attorney, Agent, or Firm* — Collard & Roe, P.C.

(57) ABSTRACT

Embodiments of the invention provide a thin film transistor, a method of manufacturing the same, an array substrate comprising the thin film transistor and a display device. The method of manufacturing the thin film transistor comprises steps of forming a gate electrode (220), a gate insulating layer (230), an oxide active layer (240), a source electrode (260) and a drain electrode (270) on a substrate (210). After forming the oxide active layer (240), the method further comprises a step of forming an etch barrier layer (250) of a metal oxide on the oxide active layer (240).

6 Claims, 2 Drawing Sheets

(51) Int. Cl.
*H01L 21/02* (2006.01)
*H01L 27/12* (2006.01)

(56) References Cited

U.S. PATENT DOCUMENTS

| | | | |
|---|---|---|---|
| 2012/0043537 A1* | 2/2012 | Karpov | C23C 18/1216 257/43 |
| 2013/0095606 A1* | 4/2013 | Bayraktaroglu et al. | 438/104 |
| 2013/0193431 A1* | 8/2013 | Yamazaki | 257/43 |
| 2014/0061634 A1* | 3/2014 | Cao et al. | 257/43 |

FOREIGN PATENT DOCUMENTS

| CN | 102656699 A | 8/2012 |
|---|---|---|
| CN | 103236402 A | 8/2013 |

OTHER PUBLICATIONS

International Search Report of PCT1/CN2013/089430 mailed on Mar. 13, 2014 in English.
International Search Report of PCT/CN2013/089430 mailed on Mar. 13, 2014.
International Preliminary Examination Report and Written Opinion of PCT/CN2013/089430 mailed on Mar. 13, 2014.
English translation of the International Preliminary Report on Patentability and Written Opinion of the International Searching Authority of PCT/CN2013/089430, issued Oct. 27, 2015.
Third Chinese Office Action of Chinese Application No. 201310153184.0, mailed Sep. 28, 2015 with English translation.

* cited by examiner

OXIDE THIN FILM TRANSISTOR WITH A METAL OXIDE ETCH BARRIER LAYER, METHOD OF MANUFACTURING THE SAME AND DISPLAY DEVICE

CROSS REFERENCE TO RELATED APPLICATIONS

This application is the National Stage of PCT/CN2013/089430 filed on Dec. 13, 2013, which claims priority under 35 U.S.C. §119 of Chinese Application No. 201310153184.0 filed on Apr. 27, 2013, the disclosure of which is incorporated by reference. The international application under PCT article 21(2) was not published in English.

TECHNICAL FIELD

Embodiments of the invention relate to a thin film transistor, a method of manufacturing the same, an array substrate and a display device.

BACKGROUND

Both an oxide thin film transistor (TFT) and an amorphous silicon TFT could be used as a driving element in display panels such as an organic light-emitting diode (OLED) display panel, a polymer light-emitting diode (PLED) display panel and the like. The carrier concentration in the oxide TFT is larger than that in the amorphous silicon TFT by 10 times. In addition, the oxide TFT may be manufactured by a magnetron sputtering method, so it is not needed to greatly change conventional production lines of the liquid crystal display panel upon adopting the oxide TFT. At the same time, as there is no limit caused by equipments used in the processes of ion implantation, laser crystallization and the like, the oxide TFT is more suitable for large-area display panels compared with a polysilicon TFT.

FIG. 1 is a structural schematic view illustrating a conventional oxide thin film transistor, which has a bottom gate. The manufacturing process of the oxide TFT is provided as follows: depositing a gate metal layer on a glass substrate 110, and forming a gate electrode 120 by an etching process; depositing a gate insulating layer 130 and an oxide semiconductor layer which may be formed by indium gallium zinc oxide (IGZO), and wet-etching the oxide semiconductor layer to form an active layer 140; depositing a $SiO_x$ (silicon oxide) layer, and forming an etch barrier layer 150 by an etching process; and finally forming a source electrode 160 and a drain electrode 170.

In the above manufacturing process, gas molecules in the reaction atmosphere enter into a plasma and are decomposed into charged ions during the process of forming the etch barrier layer of $SiO_x$. These charged ions have high energy and may generate a bombardment effect when they are jetted to the substrate by the plasma. This may form defects on the surface of the IGZO thin film that has been formed on the substrate, and in this case, the performance of the oxide TFT may be deteriorated. In addition, it cannot efficiently prevent the water vapor from diffusing into the active layer 140 in the case of adopting $SiO_x$ to form the etch barrier layer, and in this case, the performance of the oxide TFT may be further deteriorated. In addition, the $SiO_x$ thin film is generally deposited by using a chemical vapor deposition (CVD) apparatus, and such apparatus is expensive and huge and has high energy consumption.

SUMMARY OF THE INVENTION

An embodiment of the invention provides a method of manufacturing a thin film transistor. The method comprises steps of forming a gate electrode, a gate insulating layer, an oxide active layer, a source electrode and a drain electrode on a substrate. After forming the oxide active layer, the method further comprises a step of forming an etch bather layer of a metal oxide on the oxide active layer.

For example, the step of forming the etch barrier layer of the metal oxide on the oxide active layer comprise: forming a metal layer on the oxide active layer; and oxidizing the metal layer to form the etch barrier layer of the metal oxide.

For example, the step of forming the metal layer on the oxide active layer comprise: coating a solution comprising metal ions on the oxide active layer, and forming the metal layer on the oxide active layer by a chemical plating process.

For example, the step of oxidizing the metal layer to form the etch barrier layer of the metal oxide comprise: heating the substrate having the metal layer while supplying oxygen.

For example, after the step of forming the metal layer on the oxide active layer and before the step of oxidizing the metal layer to form the etch barrier layer of the metal oxide, the method further comprises a step of cleaning the substrate to remove an excessive amount of the solution comprising metal ions.

For example, the metal ions are $Al^{3+}$.

For example, the solution comprising metal ions further comprises: at least one selected from a complexing agent, a stabilizing agent, a surfactant, an accelerator and a pH regulator.

For example, the solution comprising metal ions is coated on the oxide active layer by a spin coating process.

An embodiment of the invention provides a thin film transistor. The thin film transistor comprises: a gate electrode, a gate insulating layer, an oxide active layer, a source electrode and a drain electrode formed on a substrate. The thin film transistor further comprises an etch barrier layer made of a metal oxide and formed on the oxide active layer.

For example, the metal oxide is aluminum oxide.

An embodiment of the invention provides an array substrate. The array substrate comprises the above thin film transistor.

An embodiment of the invention further provides a display device. The display device comprises the above array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In the method of manufacturing a thin film transistor according to an embodiment of the invention, a gate electrode, a gate insulating layer, an oxide active layer, a source electrode and a drain electrode are formed on a substrate. After forming the oxide active layer, an etch barrier layer formed of a metal oxide is formed on the oxide active layer, i.e. the etch barrier layer is made of the metal oxide.

Figure 1:
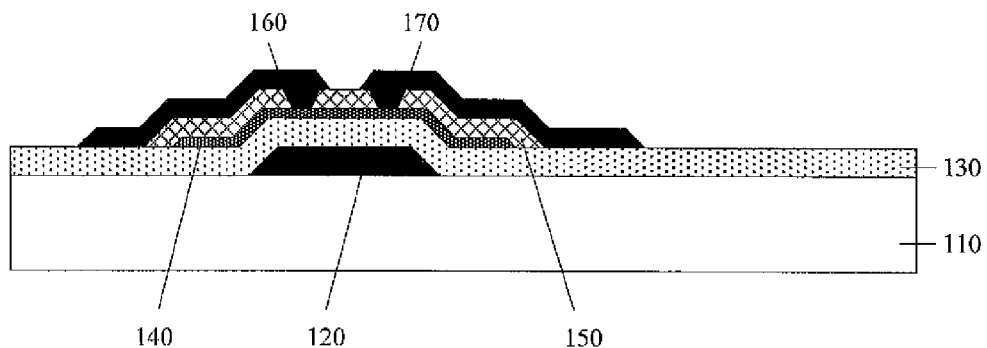
FIG. 1 is a structural schematic view illustrating a conventional oxide thin film transistor.
Figure 2:
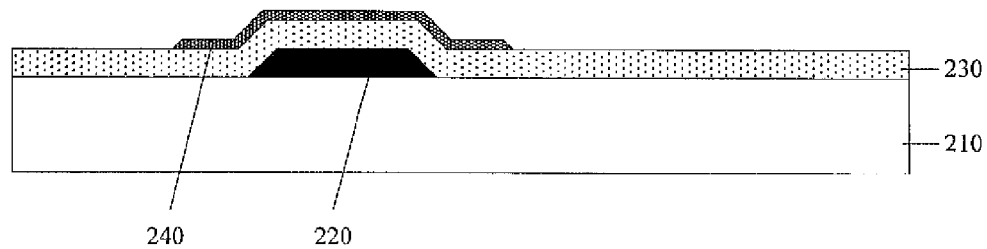
FIG. 2 is a schematic view illustrating forming a gate electrode, a gate insulating layer and an oxide active layer on a substrate in a method of manufacturing a thin film transistor according to an embodiment of the invention.

Hereinafter, a TFT of bottom gate type is taken as an example to explain the method of manufacturing the thin film transistor according to the embodiment of the invention in detail. The manufacturing method comprises the following steps:

Step 1, sequentially forming a gate electrode 220, a gate insulating layer 230 and an oxide active layer 240 on a substrate 210, as shown in FIG. 2. The gate electrode 220, the gate insulating layer 230 and the oxide active layer 240 may be respectively formed by patterning processes. For example, each of the patterning processes comprising coating photoresist, exposing, developing, etching, peeling off photoresist and the like. The oxide active layer may be formed by IGZO.

Step 2, forming an etch barrier layer made of a metal oxide on the oxide active layer.

For example, the step may include the following steps: forming a metal layer on the oxide active layer, and oxidizing the metal layer to form the etch barrier layer made of the metal oxide.

Figure 3:
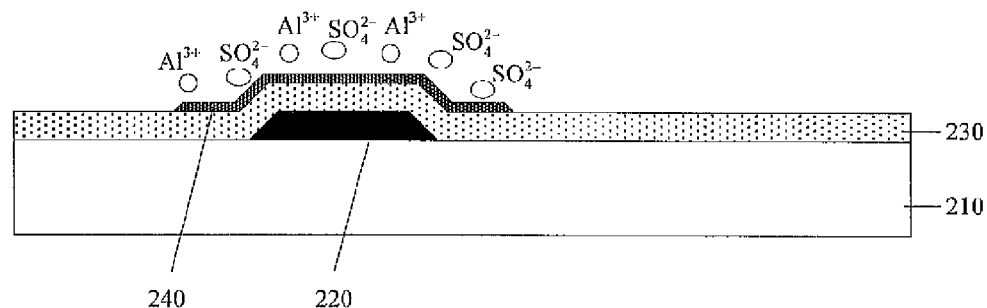
FIG. 3 is a schematic view illustrating coating a solution comprising Al ions on the structure illustrated in FIG. 2.
Figure 4:
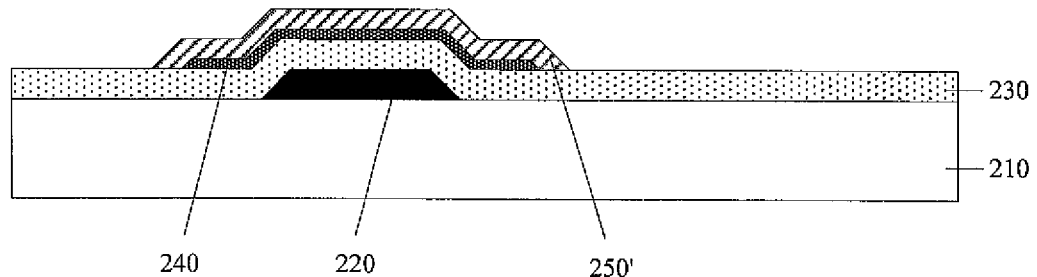
FIG. 4 is a schematic view illustrating forming an aluminum thin film by the solution comprising Al ions.

As shown in FIG. 3 and FIG. 4, for example, the step of forming the metal layer on the oxide active layer comprises: coating a solution comprising metal ions on the oxide active layer, and forming the metal layer 250' on the oxide active layer 240 by a chemical plating process.

As the oxide active layer 240 and the gate insulating layer 230 are respectively formed by materials with different properties, the metal layer 250' is only formed on the oxide active layer 240 but not on an exposed portion of the gate insulating layer 230 by controlling parameters of the chemical plating process, as shown in FIG. 4.

For example, the solution comprising metal ions is coated on the surface of the substrate that has the oxide active layer by a spin coating process. Compared the conventional technology of forming the etch barrier layer of $SiO_x$ by a chemical vapor deposition method, the above spin coating process has a smaller cost. In addition, the apparatus of the spin coating process occupies a smaller space, operates easily and consumes less energy.

Figure 5:
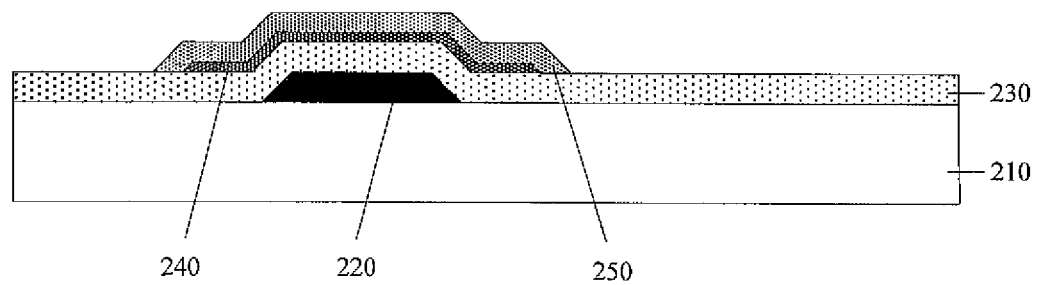
FIG. 5 is a schematic view illustrating forming an aluminum oxide layer by oxidizing the Al thin film.

Then, as shown in FIG. 5, the metal layer 250' is oxidized to form the etch barrier layer 250 of the metal oxide.

As excessive amount of the solution may be remained on the surface of the metal layer after the metal layer has been formed, a clean process is performed to remove the excessive amount of the solution on the surface of the metal layer before oxidizing the metal layer. For example, the oxidizing the metal layer to form the etch barrier layer made of the metal oxide may be: heating the substrate having the metal layer 250' while supplying oxygen, so that the metal layer 250' is completely oxidized.

For example, the solution comprising metal ions further comprises: one or two or more of a complexing agent, a stabilizing agent, a surfactant, an accelerator and a PH regulator.

The complexing agent may be ethylenediamine tetraacetic acid or tartaric acid. On the one hand, the complexing agent can enhance the polarization of the metal ions so that the obtained metal layer is fine and smooth; on the other hand, the complexing agent can stabilize the solution for spin coating. The stabilizing agent may be $Na_2S$, and the stabilizing agent can ensure the stabilization of the metal ions. The surfactant may be sodium tartrate, and the surfactant can reduce the surface tension of the solution so that hydrogen gas generated from the reaction of forming the metal layer can easily escape from the surface of the formed metal layer to avoid the hydrogen embrittlement phenomenon. The accelerator may be malonic acid, and the accelerator can increase the formation rate of the metal layer. The PH regulator may be aqueous ammonia, and the PH regulator can adjust the PH value of the solution to prevent the dissolution of the metal layer.

As Al has the chemical property of being oxidized easily, the solution comprising metal ions may be a chemical solution comprising $Al^{3+}$. Furthermore, the chemical solution comprising $Al^{3+}$ may be saline solution comprising $Al^{3+}$, such as sulphate solution comprising $Al^{3+}$. As shown in FIG. 3, the solution may further comprise $SO_4^{2-}$.

Figure 6:
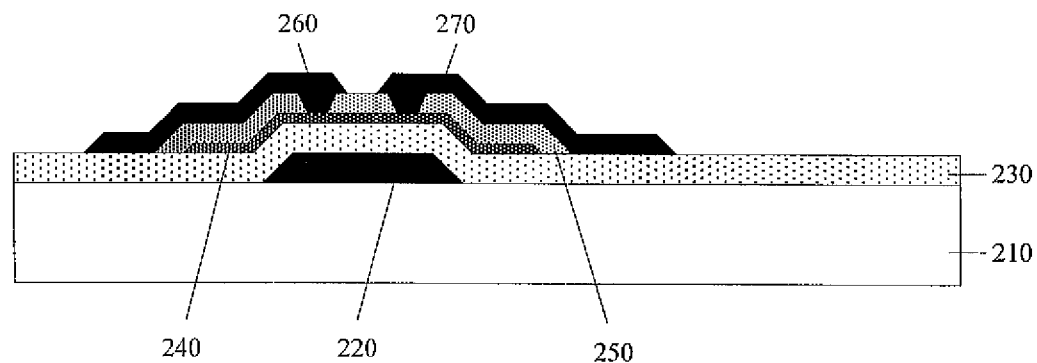
FIG. 6 is a structural schematic view illustrating a thin film transistor after forming a source electrode and a drain electrode.

Step 3, forming a source electrode 260 and a drain electrode 270. Thus, the oxide TFT as shown in FIG. 6 is formed.

In the embodiment of the invention, the etch barrier layer made of the metal oxide can effectively prevent the influence of the external water vapor on the oxide TFT. Besides, the oxide active layer is not damaged during the process of forming the etch barrier layer made of the metal layer, thereby performance of the oxide TFT can be ensured.

The method of manufacturing the thin film transistor according to the embodiment of the invention is not limited to manufacture the TFT of bottom gate type, and it is suitable to manufacture the TFT of top gate type as well. As for the TFT of top gate type, a light-shielding layer, an insulating separation layer, a source electrode and a drain electrode, an oxide active layer, an etch barrier layer, a gate insulating layer and a gate electrode are sequentially formed on a substrate. The step of forming the etch barrier layer is similar with that in the above TFT of bottom gate type, and the detailed descriptions thereof are omitted here.

An embodiment of the invention provides a thin film transistor, which is manufactured by the above method. The thin film transistor comprises: a gate electrode, a gate insulating layer, an oxide active layer, a source electrode and a drain electrode formed on a substrate. In order to better protect the oxide active layer so that the influence on the performance of TFT during the manufacturing process can be prevented and the influence of the external water vapor on the obtained TFT can be prevented, the thin film transistor further comprises an etch barrier layer made of a metal oxide and formed on the oxide active layer.

As for the TFT of bottom gate type, the etch barrier layer is provided between the oxide active layer and the source and drain electrodes. As for the TFT of top gate type, the etch barrier layer is provided between the oxide active layer and the gate insulating layer.

An embodiment of the invention provides an array substrate. The array substrate comprises a plurality of gate lines and a plurality of data lines. The gate lines and the data lines intersect with each other to form a plurality of pixel units in an array form. Each of the pixel units comprises a thin film transistor as described above.

An embodiment of the invention further provides a display device, and the display device comprises the above array substrate. For example, the display device may be a liquid crystal display panel, an e-paper, an OLED display panel, a PLED display panel, a mobile phone, a tablet computer, a television, a display, a notebook computer, a digital photo frame, a navigator or any products or components having a display function.

The foregoing embodiments merely are exemplary embodiments of the invention, and not intended to define the scope of the invention, and the scope of the invention is determined by the appended claims.

What is claimed is:

1. A method of manufacturing a thin film transistor, comprising steps of forming a gate electrode, a gate insulating layer, an oxide active layer, a source electrode and a drain electrode on a substrate,
wherein after forming the oxide active layer, the method further comprises a step of forming an etch barrier layer of a metal oxide on the oxide active layer,
the step of forming the etch barrier layer of the metal oxide on the oxide active layer comprises: forming a metal layer on the oxide active layer; and oxidizing the metal layer to form the etch barrier layer of the metal oxide; and
the step of forming the metal layer on the oxide active layer comprises: coating a solution comprising metal ions on the oxide active layer, and forming the metal layer on the oxide active layer by a chemical plating process.

2. The method of manufacturing the thin film transistor according to claim 1, wherein the step of oxidizing the metal layer to form the etch barrier layer of the metal oxide comprises:
heating the substrate having the metal layer while supplying oxygen.

3. The method of manufacturing the thin film transistor according to claim 1, wherein, after the step of forming the metal layer on the oxide active layer and before the step of oxidizing the metal layer to form the etch barrier layer of the metal oxide, the method further comprises a step of cleaning the substrate to remove an excessive amount of the solution comprising metal ions.

4. The method of manufacturing the thin film transistor according to claim 1, wherein the metal ions are $Al^{3+}$.

5. The method of manufacturing the thin film transistor according to claim 1, wherein the solution comprising metal ions further comprises: at least one selected from a complexing agent, a stabilizing agent, a surfactant, an accelerator and a pH regulator.

6. The method of manufacturing the thin film transistor according to claim 1, wherein the solution comprising metal ions is coated on the oxide active layer by a spin coating process.

* * * * *